United States Patent [19]

Martin et al.

[11] Patent Number: 5,557,120
[45] Date of Patent: Sep. 17, 1996

[54] WAFER JOINED OPTOELECTRONIC INTEGRATED CIRCUITS

[75] Inventors: Eric A. Martin, Medford; Kenneth Vaccaro, Acton; Joseph P. Lorenzo, Stow; Andrew Davis, Boston, all of Mass.

[73] Assignee: The United States of America as represented by the Secretary of the Air Force, Washington, D.C.

[21] Appl. No.: 443,915

[22] Filed: May 17, 1995

Related U.S. Application Data

[62] Division of Ser. No. 274,882, Jul. 14, 1994, Pat. No. 5,472,914.

[51] Int. Cl.⁶ .................. H01L 31/062; H01L 31/113
[52] U.S. Cl. .................. 257/291; 257/187; 257/192; 257/289
[58] Field of Search .................. 257/184, 185, 257/186, 187, 189, 192, 195, 200, 201, 289, 291

[56] References Cited

U.S. PATENT DOCUMENTS

| | | | |
|---|---|---|---|
| 4,774,205 | 9/1988 | Choi et al. | 437/59 |
| 4,833,512 | 5/1989 | Thompson | 357/22 |
| 4,900,591 | 2/1990 | Bennett et al. | 427/255 |
| 5,008,213 | 4/1991 | Kolesar, Jr. | 437/51 |
| 5,170,228 | 12/1992 | Sasaki | 257/184 |
| 5,404,581 | 4/1995 | Honjo | 455/90 |

*Primary Examiner*—Ngân V. Ngô
*Attorney, Agent, or Firm*—Gerald B. Hollins; Thomas L. Kundert

[57] ABSTRACT

A full wafer to full wafer integrated circuit apparatus wherein substrate removal and replacement on one wafer has been used to enable an accurate alignment of this wafer with features of a receiving wafer during a see through alignment step. The invention is disclosed in terms of a wafer of photo field effect transistors being combined with a wafer of circuit devices that attend the photo feed effect transistor devices. Use of the invention with the different material combination option desired for a photodetector device and its attending circuitry is also disclosed. Advantages over the more conventional chip by chip combination of wafer devices are also disclosed.

17 Claims, 2 Drawing Sheets

WAFER JOINED OPTOELECTRONIC INTEGRATED CIRCUITS

RIGHTS OF THE GOVERNMENT

The invention described herein may be manufactured and used by or for the Government of the United States for all governmental purposes without the payment of any royalty.

CROSS REFERENCE TO RELATED APPLICATIONS

This is a division of application Ser. No. 08/274,882, filed Jul. 14, 1994, now U.S. Pat. No. 5,472,914. The present document is somewhat related to the copending and commonly assigned patent applications "BACKSIDE ILLUMINATED FET OPTICAL RECEIVER AND METHOD WITH GALLIUM ARSENIDE SPECIES", Ser. No. 08/274,931; FET OPTICAL RECEIVER USING BACKSIDE ILLUMINATION, INDIUM PHOSPHIDE SPECIES", Ser. No. 08/274,930; and "BACKSIDE ILLUMINATED MSM DEVICE", Ser. No. 08/274,889 which are filed of even date herewith in the names of different inventor entities. The contents of these related applications are hereby incorporated by reference herein.

BACKGROUND OF THE INVENTION

This invention relates to the field of joined-together but possibly dissimilar substrate-received integrated circuit devices, for example to devices showing one component of the optical type and additional components of the electrical type.

Assembly of electronic circuit components from the dissimilar semiconductor materials that are often required for e.g. a combined optical and electronic systems, i.e. for optoelectronic systems onto a common circuit substrate has traditionally been achieved through hybrid integration procedures wherein component elements from different semiconductor materials are collected individually side by side onto a common dielectric substrate. This process which involves handling individual subelements (i.e. circuit die) is expensive and time consuming and precludes benefits such as the optimum reduction of parasitic distances between components. The alignment distances and metallization thickness used in such an assembly are in fact quite crude as compared to those realizable with photolithographic techniques, which can realize submicron features. Hence circuit performance in such hybrid devices are fundamentally limited.

Recently attempts have been made to monolithically integrate these circuits through the growth of dissimilar materials onto a common substrate, such as by growing Indium Phosphide or Gallium Arsenide semiconductor layers onto a Silicon substrate. These attempts have been hampered however by fundamental crystallographic differences in the materials, differences which severely limit achieved device quality. Although this type of monolithic integration promises to become a technique of choice once growth capabilities are advanced, a presently achievable technique is here disclosed for achievement of this optoelectronic and other circuit integrations. The patent of E. S. Kolesar Jr., U.S. Pat. No. 5,008,213, discloses the use of epoxy materials in the fabrication of multiple die sourced electronic circuit devices. Both this patent and the reference patents cited for the examination of this patent are believed to be of background interest with respect to the present invention.

This reference does not, however, disclose the full wafer marriage of possible dissimilar material-based electronic circuit die and the use of, substrate-removed, see through alignment techniques to achieve this marriage as is accomplished in the present invention.

SUMMARY OF THE INVENTION

In the present invention a full wafer array of electronic circuit devices such as photodetector transistors are married with a full wafer array of attending circuitry devices using a substrate removal and see-through alignment procedure. The resulting aligned and bonded-together wafers may be of different semiconductor material so the advantages of photodetectors fabricated from an optimum material and attending or electrically ancillary circuitry (such as amplifiers, switches and bias sources) fabricated from a different optimum material are possible.

It is an object of the present invention therefore to provide a two wafer electronic circuit assembly fabrication procedure.

It is another object of the invention to provide a removed substrate two wafer visual alignment procedure for the full wafer fabrication of circuit assemblies.

It is another object of the invention to enable the use of optimum fabrication materials in both a phototransducer device and in the amplifiers and other circuits attending such devices.

It is another object of the invention to provide a two wafer assembly procedure that can be used with many types of electronic circuit devices.

It is another object of the invention to provide an adhesive based two wafer circuit assembly procedure.

It is another object of the invention to provide for the combination of arsenic inclusive semiconductor materials such as gallium arsenide with silicon or indium phosphide or other semiconductor materials in a single circuit assembly.

It is another object of the invention to provide a multiple substrate electrical circuit fabrication process in which each of the joined together circuits is previously frozen in geometric precision to enable large area accurate joining.

It is another object of the invention to realize the advantages available from the combining of a substrate removal procedure with the (thusly enabled) accurate visual alignment of joined substrates.

It is another object of the invention to overcome the tedious, costly, and quality degrading aspects of combining different substrate mounted integrated circuit devices using a single die at a time procedure.

It is another object of the invention to provide a two-substrate removal process for joining multiple wafer-received integrated circuit die.

Additional objects and features of the invention will be understood from the following description and claims and the accompanying drawings.

These and other objects of the invention are achieved by electro-optical apparatus comprising:

a sacrificial first substrate member comprised of soda glass covered by a thin layer of one of the materials of silicon dioxide and iron oxide;

an indium gallium arsenide and indium aluminum arsenide comprised mesa-configured photo-field effect transistor having gold germanium nickel alloy source and drain-connected ohmic metal contacts received over mesa top and side portions thereof and a titanium gold alloy non conducting gate electrode;

said mesa-configured photo-field effect transistor being adhesive attached to an underside surface of said thin layer coated soda glass first sacrificial substrate member at said gold germanium nickel source and drain-connected metal electrode top portions thereof;

a permanent second substrate member comprised of a second semiconductor substrate material;

a plurality of additional mesa elements monolithically disposed on an upper surface portion of said second semiconductor substrate member in relative physical location coincidence with selected portions of said first substrate member-received photo-field effect transistor;

said additional mesa elements also including gold germanium nickel alloy-compatible metal electrode areas received over mesa top portions thereof;

a photo-field effect transistor electrically-ancillary electrical circuit element also received on an upper surface portion of said second substrate member intermediate said additional mesa elements and electrically connected with said additional mesa element metal electrode areas; and means for anneal bonding said additional mesa element metal electrode areas of said second substrate member to said source and drain-connected metal electrode portions of said first substrate member-received photo-field effect transistor and for retaining said first and second substrate members in fixed intimate parallel disposition.

Figure 1A:
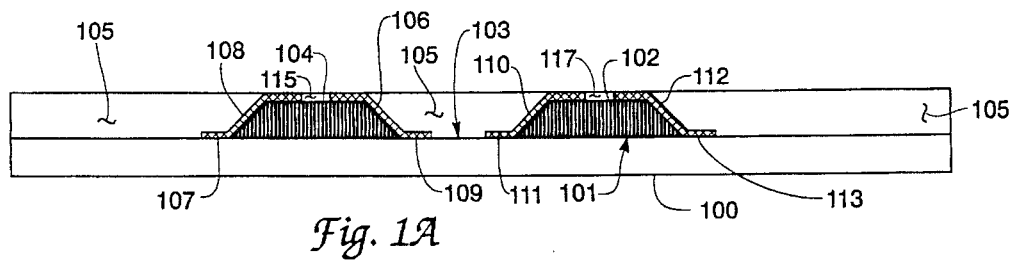
FIG. 1A shows a first sacrificial substrate received pair of photodetector devices according to the invention.

FIG. IF shows the permanent substrate mounted devices in completed or ready for subsequent processing form.

DETAILED DESCRIPTION

High data rate optical communications systems such as those proposed for the emerging United States national information infrastructure require high speed optoelectronic components for conversion of electrical signals into optical pulses, and for the reciprocal process of detecting received optical signals. To keep bandwidth of these systems high, parasitic circuit elements within the transmit and receive components of the system must be minimized. This is best achieved through integration of all components of a receiving or transmitting apparatus onto a common substrate, thus reducing electrical interconnect distances between elements. Electronics technology has advanced from discrete transistors to highly functional integrated circuits through the concept of monolithic integration. In this monolothic integration large numbers of components (in this case transistors) are fabricated simultaneously on a common substrate— usually a silicon wafer. This single silicon substrate leads to the term "monolithic" which according to Webster's dictionary arises from the concept of a single crystal or a "single stone".

Optically active multi-gigahertz electronic and photonic components need however to be fabricated from materials other than silicon. Herein a process is described for fabricating devices on their respective optimum substrates, then combining them while still at the wafer level. We define this process as polylithothetic integration ("polylithic" for "multi-stone" in contrast to monolithic; "lithothetic" for "stone setting" in contrast to lithographic or "stone writing").

Through this lithothetic process, components from dissimilar materials are thinned and supported so that they can be assembled into a functioning circuit using standard photolithographic equipment which provides "see through" alignment registration that is thousands of times more accurate than is achievable through hybrid techniques. After the devices are thinned a sacrificial supporting substrate holds the geometrical patterning of the devices in frozen geometric precision as they were fabricated on the original wafer. This sacrificial substrate is also provided with optical transmission properties and thereby acts much like a common mask used for photolithographic realization of microelectronics. Rather than being a shadow mask that only transfers the physical layout of the desired structures, this substrate contains actual functioning devices however.

All microelectronics and electro-optic devices also consist of metallurgical junctions and interfaces defined through some patterning process. Lithography is the most common patterning technique, yet is by itself insufficient to produce functionality and further process steps are required. In the invention described here, that of polylithothetic integration, circuit functionality is transferred onto a permanent semiconducting substrate which includes receptor metallurgical junctions. Hence not only a pattern, but a circuit die interface is transferred with complete functionality resulting. The presently described method therefore is believed to represent an evolution increment in microelectronics and micro-optoelectronic technology.

Although the description following is based on the marriage or integration of an optical transducer device from one wafer with attending electrical circuitry and a physical support structure from a second wafer, it should be apparent that the described arrangements may be used with non optical electronic devices so long as the see-through alignment step can be achieved. Substrate removal is of course an enabling part of this marriage sequence.

The active semiconducting layers of the herein described optical detector may be grown epitaxially on three inch or other size InP wafers, i.e. on a first sacrificial substrate 100, by Molecular Beam Epitaxy (MBE) or MOCVD techniques. In contact with the InP substrate 100 in FIG. 1 is grown an Indium Aluminum Arsenide (InAlAs) buffer layer/etch stop which is indicated at 101 in FIG. 1, but which is so thin (i.e. 0.1 micrometers) as to not be shown as a discrete layer in the FIG. 1 drawing.

An indium phosphide (InP) substrate 100 is used in the FIG. 1 fabrication sequence in order to desirably determine the crystal structure of the arsenic inclusive materials added to this substrate in fabricating the optoelectronic transducer devices 102 and 104 in subsequent steps. Additional details concerning use of one semiconductor material to determine the crystal structure of a different epitaxially formed layer and thereby select the spectral response region of a fabricated phototransistor etc. are disclosed in the copending applications referred to above and incorporated by reference herein.

After growth of the buffer layer 101, the InGaAs optical energy absorbing region for the optical detectors, the optically absorbing channel layer for photo-FETs 102 and 104, is grown. This can be achieved with a procedure that is similar to that used in the copending Martin et al Ser. No. 08/274,930 patent document. The thickness of this optical energy absorbing layer affects the efficiency of the detector as is known in the art. Lastly is grown an InAlAs layer which forms a current blocking barrier. After material growth, the devices are patterned lithographically and chemically etched to produce the FIG. 1 illustrated mesas of layered epitaxial material.

Ohmic (conducting) electrical contacts 106, 108, 110, and 112 are formed on these mesas by evaporating layers of gold-germanium-nickel (AuGeNi) alloy onto the mesa surfaces. Electrical gate (non-conducting) electrodes, not shown in FIG. 1, are then produced by evaporated titanium-gold (Ti/Au). These metal ohmic and gate contacts reach from the active device top surface of the mesa down the sloping sides to the exposed InP surface 103. The contact surface regions on the InP will later be exposed by substrate removal and form the basis for electrical contacting of the FIG. 1A device with the second substrate devices as described below. This completes fabrication of the detectors 102 and 104. In the instance when the optoelectronic device being fabricated in FIG. 1 is a photo MESFET, the thus-far accomplished portions of the FIG. 1 processing sequence may resemble the similar early portions of the fabrication sequence in the Ser. No. 08/274,930 patent document.

After completion of the device 102 and 104, the upward facing surfaces of these devices, including the metal conductors 106, 108, 110 and 112 are covered with a pliant uncured adhesive material such as an epoxy adhesive. This adhesive layer is indicated at 105 in FIG. 1A; the material of this layer also fills the regions 115 and 117 between ends of the electrodes 106, 108 and 110, 112. The adhesive used at 105 is preferably of the H74 type thermal conducting electrically insulating type sold by Epoxy Technology Inc. of Billerica, Mass. This adhesive or its equivalent is sufficiently transparent in both its uncured and cured states to enable the see-through alignment of the FIG. 1C step as is described below.

For backside processing of the FIG. 1A devices 102 and 104, the front of the FIG. 1A subassembly is fixed to an intermediary or second sacrificial substrate plate 116 by the adhesive of the layer 105. This fixing is achieved by bringing the FIG. 1A structure including the uncured adhesive layer 105 into contact with the layer 118 of the substrate plate 116 and holding this contact position with a small force during the adhesive cure sequence specified by the manufacturer. The appearance of the devices 102 and 104 and the substrate plate 116 during this curing is as shown in FIG. 1B of the drawings.

Figure 1B:
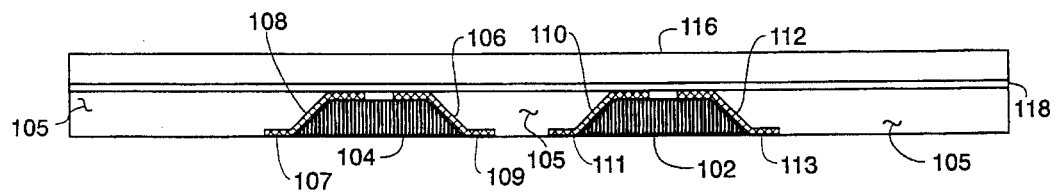
FIG. 1B shows the FIG. 1A devices attached to a second sacrificial substrate member.

The intermediary substrate plate 116 is provided with the above referred-to surface coating layer 118 in order to form an undercut layer shown layer, a layer also deemed to be shown at 118 in FIG. 1B. This undercut layer is preferably composed of silicon dioxide formed according to the low temperature process of U.S. Pat. No. 4,900,591 which is also incorporated by reference herein. This undercut layer 118 forms the means for later removal of the intermediary substrate plate 116. The undercut layer 118 may actually be fabricated from either silicon dioxide or iron oxide, materials which are typical transparent thin film coatings for photomasks. The undercut layer 118 preferably has a thickness greater than 0.1 micrometers. The intermediary or second sacrificial substrate plate 116 is preferably made of glass, e.g. soda glass, which provides the desired dimensional stability to maintain the frozen geometric precision of the FIG. 1A structure and has the desired optical transparency. The second substrate plate 116 itself preferably has a thickness greater than one millimeter.

Returning again to FIG. 1A and 1B, to accomplish the FIG. 1A to FIG. 1B illustrated first sacrificial substrate 100 removal, the InP substrate 100 is thinned from a typical thickness of 500 micrometers to as little as one micrometer by polishing with, for example, 5 micrometer alumna grit in water. The remainder of the InP substrate 100 is removed by chemical etching in 4:1 HCl:H$_2$O or 1:1 HCl: water. This etch selectively removes the InP from all areas, including from the metal electrode pads 107, 109, 111 and 113 of the devices 102 and 104. Following removal of the first sacrificial substrate 100, the photo-FETs 102 and 104 remain attached to the second substrate plate 116.

The substrate plate 116 and the devices 102 and 104 are then aligned visually to a third or tertiary substrate 122, which is the permanent substrate and which contains additional electrical functionality. A contact mask aligner easily performs this task—as readily as it does the alignment of a common shadow mask to a semiconductor substrate. This alignment process is shown in FIG. 1C, where the FIG. 1A elements are shown with their original numbering and where typical additional electrical components e.g. the mesas of two attending transistors 124 and 126, are shown to be received on the permanent substrate 122.

Also shown on the substrate 122 are the smaller landing mesas 123, 125, 127 and 129 which are provided with the complementary conductors or pads 131, 132, 133 and 134 which are to receive and bond with the electrode pads 107, 109, 111 and 113 of the conductors 106, 108, 110 and 112 of the optoelectronic transducer devices 102 and 104. The transistors 124 and 126 may be bias supply or amplifier transistors for the optoelectronic transducer devices 102 and 104 for example. As represented in FIG. 1C the metal conductors 108 and 112 of the optoelectronic transducer devices 104 and 102 are, for example, intended for direct electrical connection with the metal pads 131 and 134 of the transistors 126 and 124.

Figure 1C:
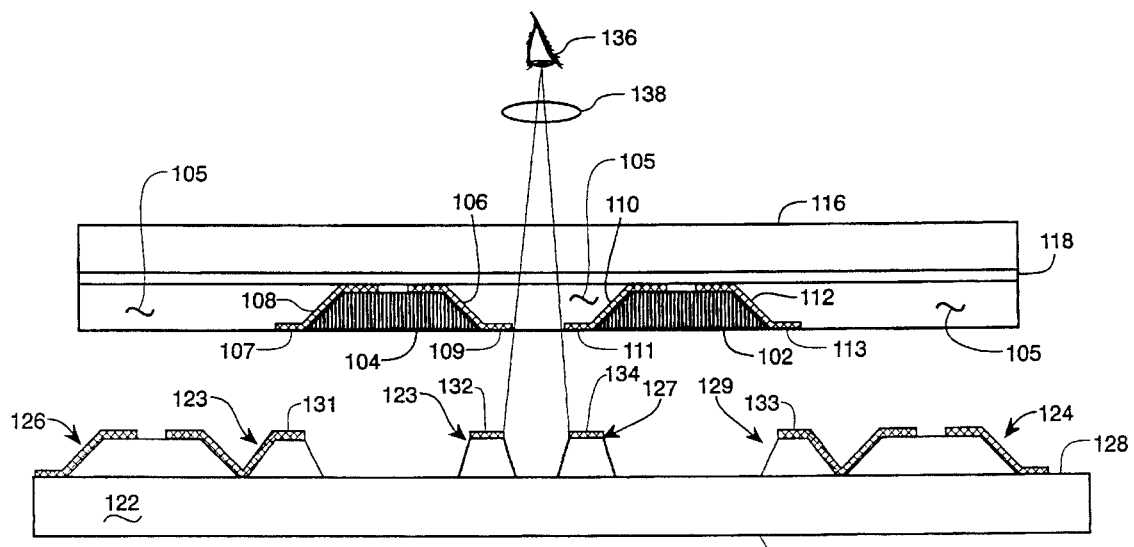
FIG. 1C shows alignment of the FIG 1B devices with third (and permanent) substrate-received complementing circuit devices.

FIG. 1C also shows in representative form the visual alignment apparatus which may, as indicated above actually, comprise a contact mask aligner of the type known in the integrated circuit art. In FIG. 1C the eye 136 and the lens 138 are used to represent this mask aligner apparatus. The alignment represented in FIG. 1C is of course accomplished for all of the devices on the two substrates 116 and 122, since these devices are presumed to be fabricated in registration.

Figure 1D:
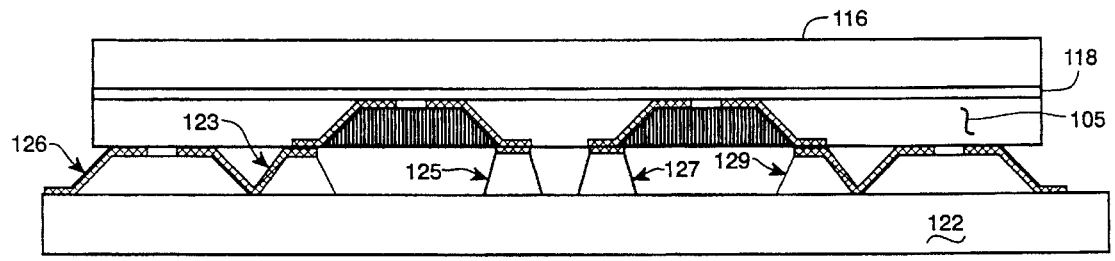
FIG. 1D shows the two substrate-mounted devices after bonding together.

After the FIG. 1C alignment the conductors or pads of the two substrates 116 and 122 are brought into approximate physical contact, just as a shadow mask is brought into contact with a semiconductor substrate during contact lithography. Several bonding means are available to electrically join the conductors of the substrate 116 to those of the substrate 122. The method preferred is to form bonded metal-metal contacts between the pad 107 of the conductor 108 and the pad 131 of the device 126 and its landing mesa 123. These pads are readily joined with simple annealing. In the case of indium-indium bonds this annealing may take place at about 250 degrees C. An additional and physical joining approach is to form a bead of adhesive such as epoxy on the rim of the substrate 122, making a seal to the intermediary plate or substrate 116 during the metal-metal fusing. The joined devices are shown in FIG. 1D.

Following device joining the intermediary plate second sacrificial substrate 116 is removed through selective undercut etching of the undercut layer 118. This layer, either silicon dioxide or iron oxide is dissolved, for the case of the silicon dioxide layer in a solution of hydrofluoric acid. This etch step does not affect the formed devices 102 and 104 in any manner. This undercut layer removal is indicated in FIG. 1E by the space at 144 and 146.

Figure 1E:
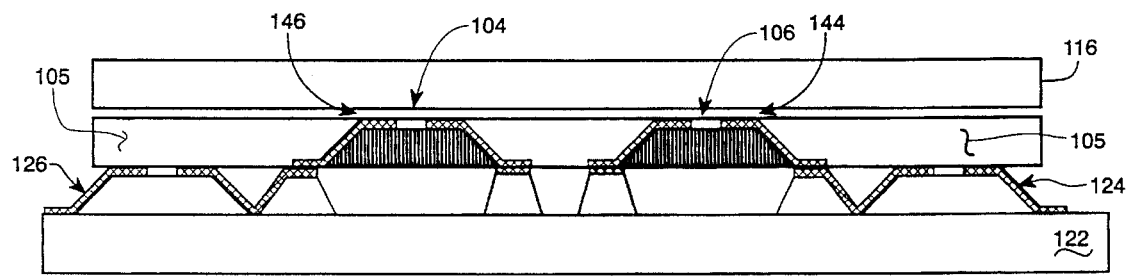
FIG. 1E shows the bonded-together devices after removal of the second sacrificial substrate.
Figure 1F:
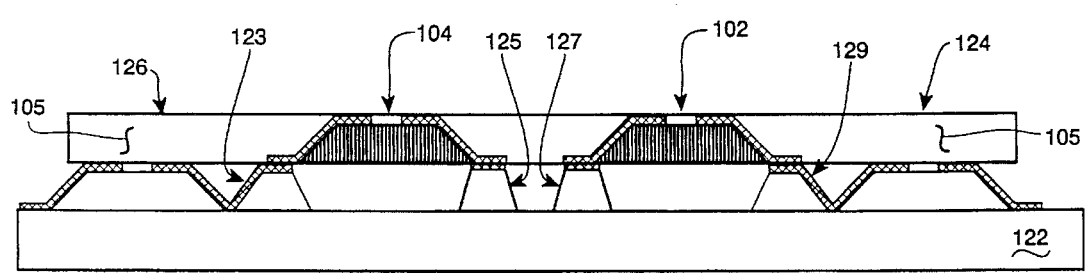

The final integrated structure is also indicated in FIG. 1E. At this stage the permanent third or tertiary wafer substrate 122 is intact, and circuit fabrication and packaging may continue as normal. Additional interconnect metallizations and passivation may for example be performed on the FIG. 1E wafer as a whole. The FIG. 1E wafer as it appears prior to any such additional interconnect metallizations and passivation is shown with some added detail in FIG. 1F.

The described process has therefore integrated all of the circuits present on multiple wafers (typically there are hundreds of such circuits on each wafer) simultaneously, greatly reducing assembly time as compared with multi-chip modules or hybrid assembly processes.

It is significant to note therefore that through the combined use of substrate removal (in this case removal of two substrates) and see-through alignment of wafers that are to be merged, the present invention enables the one step act combining of circuit elements arrayed on two different substrate wafers. Such wafer-scale combining or marriage of circuits has been long sought-after in the electronic art, but has heretofore been impractical outside of a laboratory setting if possible at all.

The disclosed method also eliminates difficulties associated with the growth of non-lattice matched materials such as InP grown on silicon by eliminating the need for such material combinations. Such growth typically results in layers with unacceptable levels of defects. The described method also allows parallel fabrication of differing device structures according to their own demands, which are often in conflict. For example, InP device structures cannot withstand many of the high temperature processes such as oxidation and diffusion which are required for silicon circuit processing. The processing advantage of the present invention also applies to wafer fusion methods which typically bond dissimilar materials before device fabrication.

In yet another advantage of the present invention, processing, which requires lift-off techniques and the use of an AlAs undercut layer grown into the epitaxial layer of a first structure are avoided. Such an AlAs layer is ultimately removed through selective wet etching. However, AlAs is not an appropriate material for growth on InP structures because of the different lattice constants involved. Attempts to grow this undercut layer on InP materials therefore result in large defect densities, which the herein described method avoids.

The herein described method also increases circuit operating bandwidth over that of a multi-chip assembly arrangement by reducing the distances between active devices. This distance reduction results at least in part from the enhanced alignment accuracy available at the wafer level as opposed to alignments obtained with discrete devices. This distance reduction directly reduces parasitic capacitance, inductance, and resistance and hence directly increases achieved circuit bandwidth.

While the apparatus and method herein described constitute a preferred embodiment of the invention, it is understood that the invention is not limited to this precise form of apparatus or method and that changes may be made therein without departing from the scope of the invention which is defined in the appended claims.

What is claimed is:

1. Partially fabricated electro-optical apparatus having a first-layer-received optical to electrical transducer device and a second layer-received electrical circuit device electrically ancillary to said optical to electrical transducer device, said apparatus comprising:

a sacrificial first substrate member comprised of a first substrate material;

a mesa-configured photo-field effect transistor having source and drain-connected metal electrodes received over mesa top and side portions thereof;

said mesa-configured photo-field effect transistor being attached to an underside surface of said first sacrificial substrate member at said source and drain-connected metal electrode top portions thereof;

a permanent second substrate member comprised of a second substrate material;

a plurality of additional mesa elements disposed on an upper surface portion of said second substrate member in relative physical location coincidence with selected portions of said first substrate member-received photo-field effect transistor;

said additional mesa elements also including metal electrode areas received over mesa top portions thereof;

a photo-field effect transistor-electrically-ancillary electrical circuit element also received on an upper surface portion of said second substrate member intermediate said additional mesa elements and electrically connected with said additional mesa element metal electrode areas; and means for bonding said additional mesa element metal electrode areas of said second substrate member to said source and drain-connected metal electrode portions of said first substrate member-received photo-field effect transistor and for retaining said first and second substrate members in fixed intimate parallel disposition.

2. The electro-optical apparatus of claim 1 wherein said sacrificial first substrate member includes a reactant-consumable removable undercut surface coating layer disposed intermediate said photo-field effect transistor source and drain-connected metal electrode top portions and a first substrate body portion.

3. The electro-optical apparatus of claim 1 further including a layer of organic adhesive material disposed surrounding said photo-field effect transistor and in intimate bonding contact with said reactant-consumable undercut surface coating layer.

4. The electro-optical apparatus of claim 3 wherein said layer of organic adhesive material comprises an epoxy adhesive having an optical transparency characteristic in one state thereof.

5. The electro-optical apparatus of claim 1 further including a plurality of one of said mesa-configured photo-field effect transistors and said photo-field effect transistor electrically ancillary electrical circuit elements.

6. The electro-optical apparatus of claim 5 further including a plurality of each of said mesa-configured photo-field effect transistors and said photo-field effect transistor electrically ancillary electrical circuit elements, said pluralities each being received on a separate wafer substrate member and said separate wafer substrate members being bonded in parallel adjacency by said means for bonding.

7. The electro-optical apparatus of claim 1 wherein said mesa-configured photo-field effect transistor comprises a plurality of epitaxial layers each epitaxially characterized by the crystal structure of an additional sacrificial substrate member of third substrate material composition.

8. The electro-optical apparatus of claim 1 wherein said means for bonding said additional mesa element metal electrode areas to said source and drain-connected metal electrode portions of said first substrate member includes means achieving both electrical and physical bonds.

9. Multiple layered integrated circuit apparatus of distinguishable semiconductor material layer compositions comprising:

a first layer substrate of first semiconductor substrate material composition;

a first array of electrical circuit elements received over an upper surface portion of said first layer semiconductor substrate in monolithic relationship therewith and in selected lateral position locations;

said first array of electrical circuit elements including a coplanar plurality of uppermost layer metal film areas laterally dispersed thereon;

a second array of electrical circuit elements, supported in coincident position locations with said selected lateral positions locations and in bonded electrical connection with said coplanar plurality of uppermost layer metal film areas on said first array of electrical circuit elements and said first layer substrate;

said second array of electrical circuit elements including semiconductor devices of a common monolithic, material and epitaxial relationship with each other and of differing monolithic and material relationship with said first array electrical circuit elements; and said second array of electrical circuit elements also including a semiconductor devices-enclosing layer of transparent epoxy adhesive material disposed in separated parallel physical relationship with said first layer substrate and said first array of electrical circuit elements.

10. The multiple layered integrated circuit apparatus of claim 9 wherein said second array of electrical circuit elements are opto-electronic semiconductor devices and said first array of electrical circuit elements includes semiconductor devices electrically ancillary to said second array of electrical circuit elements opto-electronic semiconductor devices.

11. The multiple layered integrated circuit apparatus of claim 10 wherein said opto-electronic semiconductor devices are photo-field effect transistors.

12. The multiple layered integrated circuit apparatus of claim 9 wherein said first array of electrical circuit elements are also part of an integral first integrated circuit semiconductor wafer.

13. The multiple layered integrated circuit apparatus of claim 12 further including a second substrate member and wherein said second array of electrical circuit elements is received in said selected lateral position locations on said second substrate member.

14. The multiple layered integrated circuit apparatus of claim 13 wherein said second substrate member includes a removable, thin, reactant-consumable, undercut surface coating layer disposed intermediate said second array of electrical circuit elements and a body portion of said second substrate member.

15. Electro-optical apparatus comprising:

a sacrificial first substrate member comprised of soda glass covered by a thin layer of one of the materials of silicon dioxide and iron oxide;

an indium gallium arsenide and indium aluminum arsenide comprised mesa-configured photo-field effect transistor having gold germanium nickel alloy source and drain-connected ohmic metal contacts received over mesa top and side portions thereof and a titanium gold alloy non conducting gate electrode;

said mesa-configured photo-field effect transistor being adhesive attached to an underside surface of said thin layer coated soda glass first sacrificial substrate member at said gold germanium nickel source and drain-connected metal electrode top portions thereof;

a permanent second substrate member comprised of a second semiconductor substrate material;

a plurality of additional mesa elements monolithically disposed on an upper surface portion of said second semiconductor substrate member in relative physical location coincidence with selected portions of said first substrate member-received photo-field effect transistor;

said additional mesa elements also including gold germanium nickel alloy-compatible metal electrode areas received over mesa top portions thereof;

a photo-field effect transistor electrically-ancillary electrical circuit element also received on an upper surface portion of said second substrate member intermediate said additional mesa elements and electrically connected with said additional mesa element metal electrode areas; and means for anneal bonding said additional mesa element metal electrode areas of said second substrate member to said source and drain-connected metal electrode portions of said first substrate member-received photo-field effect transistor and for retaining said first and second substrate members in fixed intimate parallel disposition.

16. The electro-optical apparatus of claim 15 wherein said mesa-configured photo-field effect transistor comprises a plurality of epitaxial layers each epitaxially characterized by the crystal structure of an additional indium phosphide sacrificial substrate member.

17. The electro-optical apparatus of claim 15 wherein said adhesive attachment is comprised of a transparent, thermally-conductive epoxy adhesive material.

* * * * *